United States Patent
Chen

(10) Patent No.: US 6,172,331 B1
(45) Date of Patent: Jan. 9, 2001

(54) METHOD AND APPARATUS FOR LASER DRILLING

(75) Inventor: Xiangli Chen, Niskayuna, NY (US)

(73) Assignee: General Electric Company, Schenectady, NY (US)

(*) Notice: Under 35 U.S.C. 154(b), the term of this patent shall be extended for 0 days.

(21) Appl. No.: 08/967,925

(22) Filed: Nov. 12, 1997

Related U.S. Application Data

(63) Continuation-in-part of application No. 08/932,715, filed on Sep. 17, 1997, now Pat. No. 6,054,673.

(51) Int. Cl.[7] .............................. B23K 26/38; B23K 26/40
(52) U.S. Cl. .................................... 219/121.71; 219/121.7
(58) Field of Search ........................... 219/121.7, 121.71; 427/454, 455

(56) References Cited

U.S. PATENT DOCUMENTS

| | | |
|---|---|---|
| 3,747,019 | 7/1973 | Koechner et al. . |
| 4,092,515 | 5/1978 | Joslin et al. . |
| 4,473,737 | 9/1984 | Anthony . |
| 4,504,727 | 3/1985 | Melcher et al. . |
| 4,564,736 * | 1/1986 | Jones et al. ...................... 219/121.68 |
| 4,870,244 | 9/1989 | Copley et al. . |
| 4,873,414 | 10/1989 | Ma et al. . |
| 5,011,626 | 4/1991 | Ma et al. . |
| 5,140,127 | 8/1992 | Stroud et al. . |
| 5,216,808 * | 6/1993 | Martus et al. ....................... 29/889.1 |
| 5,227,098 | 7/1993 | Philby et al. . |
| 5,231,263 * | 7/1993 | Kuwabara et al. ............. 219/121.73 |
| 5,293,186 | 3/1994 | Seden et al. . |
| 5,361,268 * | 11/1994 | Fossey et al. ........................... 372/23 |
| 5,593,606 * | 1/1997 | Owen et al. ..................... 219/121.71 |
| 5,704,759 * | 1/1998 | Draskovich et al. ............. 415/170.1 |
| 5,731,047 * | 3/1998 | Noddin ............................... 219/121.7 |
| 5,747,769 * | 5/1998 | Rockstroh et al. ............. 219/121.71 |
| 5,841,801 * | 11/1998 | Suzuki .................................... 372/23 |
| 5,902,647 * | 5/1999 | Venkataramani et al. ............ 427/454 |

FOREIGN PATENT DOCUMENTS

| | | | |
|---|---|---|---|
| 2-182390 | * | 7/1990 | (JP) . |
| 3-142087 | * | 6/1991 | (JP) .................................. 219/121.76 |
| 5-42382 | * | 2/1993 | (JP) . |

OTHER PUBLICATIONS

C.Y. Yeo et al., A Technical Review of the Laser Drilling of Aerospace Materials, 42 J. Materials Processing Tech. 15–49 (Dec. 1994).
X. Chen et al., Laser Drilling of Advanced Materials: Effects of Peak Power, Pulse Format, and Wavelength, 8 J. Laser App. 233–239 (Dec. 1996).
Walter Koechner, *Solid–State Laser Engineering*, 435–441, 476–481 (Dec. 1992).
"Processing of Ni–based Aero Engine Components With Repetitively Q–switched Nd:YAG–lasers" by Bostanjoglo et al., Proceedings of SPIE, The International Society for Optical Engineering vol. 289, pp. 145–157, Jun. 1996.*

* cited by examiner

*Primary Examiner*—Geoffrey S. Evans
(74) *Attorney, Agent, or Firm*—Tyler Maddry; Noreen C. Johnson

(57) ABSTRACT

A method and apparatus for laser drilling an article having a nonmetallic layer. One embodiment of the method includes the steps of generating a pulsed laser beam, a pulse of the pulse laser beam having an energy of less than or equal to 0.1 joule and a pulse width of less than or equal to 500 nanoseconds, directing the pulsed laser beam at the article to vaporize the nonmetallic layer, and directing the pulsed laser beam at the article to vaporize the substrate. The method may be carried out with an apparatus which includes a Nd:YAG laser which produces the pulsed laser beam, the pulsed laser beam having a first frequency component, and a harmonic generator which generates a second frequency component, the second frequency being greater than the first frequency, where the laser beam, after passing through the harmonic generator, is incident on the article to vaporize the nonmetallic layer.

34 Claims, 1 Drawing Sheet

METHOD AND APPARATUS FOR LASER DRILLING

This application is a continuation-in-part of U.S. Ser. No. 08/932,715, filed Sep. 17, 1997 now U.S. Pat. No. 6,054,673.

BACKGROUND

1. Field of the Invention

The present invention relates generally to laser drilling, and more particularly to a method and apparatus for drilling a hole in an article having a nonmetallic layer.

2. Description of the Related Art

Lasers are commonly used in the aerospace and power generation industries to drill holes in components. For example, lasers are commonly used to drill air cooling holes in turbine airfoils such as blades and vanes. A pulsed laser beam is directed at the article, and molten material from the focus region of the laser beam is expelled from the article. According to one known method, an Nd:YAG laser generates pulses having a pulse energy of 10 joules, a pulse duration of 1 millisecond, and a pulse repetition rate of 10 Hz, to drill holes in hollow turbine blades. The pulses are generated in a "free running" mode in which the lamps are pulsed at 10 Hz to produce the pulsed laser beam.

In aircraft engine and power generation equipment, thermal barrier coatings (TBCs), typically comprising a ceramic material, are often applied to the surfaces of components to provide thermal protection against the high temperatures which exist in operation. It has proven difficult, however, to manufacture holes in articles having a thermal barrier coating. For example, if the thermal barrier coating is applied after small diameter cooling holes have been drilled, the coating process often blocks the holes, since the total thickness of the coating, e.g. 0.010 inch, is typically of about the same magnitude as the hole diameter, e.g. 0.010–0.030 inch. Blocked holes are problematic, because they restrict or modify the air flow rate and pattern through the holes, which leads to poor engine performance.

On the other hand, performing the conventional laser drilling process after the thermal barrier coating has been applied to the article often generates cracks between the layers of coatings, leading to chipping or spallation of the coating, which reduces part life.

It would be desirable, therefore, to have a method and apparatus for drilling a hole through an article having a nonmetallic layer which would maintain the geometry of the hole and the integrity of the nonmetallic layer.

SUMMARY

According to one embodiment of the invention, a method of laser drilling a hole in an article having a nonmetallic layer comprises the steps of generating a pulsed laser beam, a pulse of the pulsed laser beam having an energy of less than or equal to 0.1 joule and a pulse width of less than or equal to 500 nanoseconds, directing the pulsed laser beam at the article to vaporize the nonmetallic layer, and directing the pulsed laser beam at the article to vaporize the substrate. The method may be carried out with an apparatus which, according to one embodiment, comprises a Nd:YAG laser which produces the pulsed laser beam, the pulsed laser beam having a first frequency component, and a harmonic generator which generates a second frequency component, the second frequency being greater than the first frequency, wherein the laser beam, after passing through the harmonic generator, is incident on the article to vaporize the nonmetallic layer.

The laser pulses produced according to exemplary embodiments of the invention typically have a relatively high peak power, for example greater than 1 megawatt, which causes material to be removed by evaporation. This removal mechanism, along with an improved energy coupling which results from the short wavelengths produced by the harmonic generator, produces substantially damage free holes and high quality coating interfaces. The method and apparatus can also provide a high processing speed due to a high pulse repetition rate and an ability to switch to a higher power longer wavelength beam after drilling through the nonmetallic layer.

BRIEF DESCRIPTION OF THE DRAWINGS

Other features and advantages of the invention will be more readily understood upon reading the following detailed description in conjunction with drawings, in which.

DETAILED DESCRIPTION OF THE PREFERRED EMBODIMENTS

Figure 1:
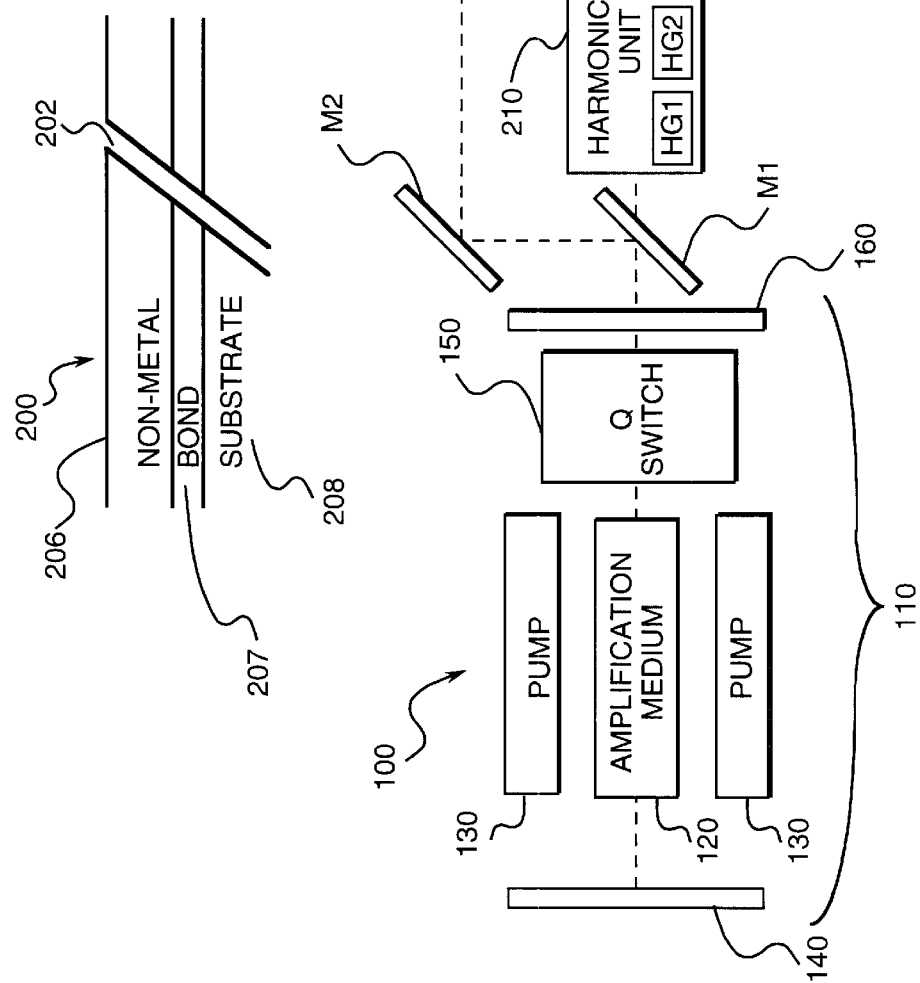
FIG. 1 is a drawing of a laser drilling apparatus according to an exemplary embodiment of the invention.

Referring to FIG. 1, a laser drilling apparatus 100 is shown according to an exemplary embodiment of the invention. The laser drilling apparatus 100 includes a laser oscillator 110 comprising an amplification medium 120, a pump 130, a mirror 140, a Q-switch 150, and an output coupler 160. In addition to the oscillator 1 10, the laser drilling apparatus 100 includes a shutter 170, a camera 180, and a harmonic generator unit 210. A mirror 190 is provided to redirect the laser beam to the target 200.

In the oscillator 110, a coherent beam of light is oscillated between the mirror 140, which is substantially 100% reflective, and the output coupler 160, which is an 80% reflective mirror according to an exemplary embodiment. The portion of the coherent beam which is transmitted through the output coupler 160 constitutes the output of the oscillator 110. After passing through the output coupler 160, the laser beam either passes through the harmonic generator unit 210 or is redirected around the harmonic generator unit 210 with mirrors M1–M4 and is then redirected with the mirror 190 to the target 200.

Figure 2:
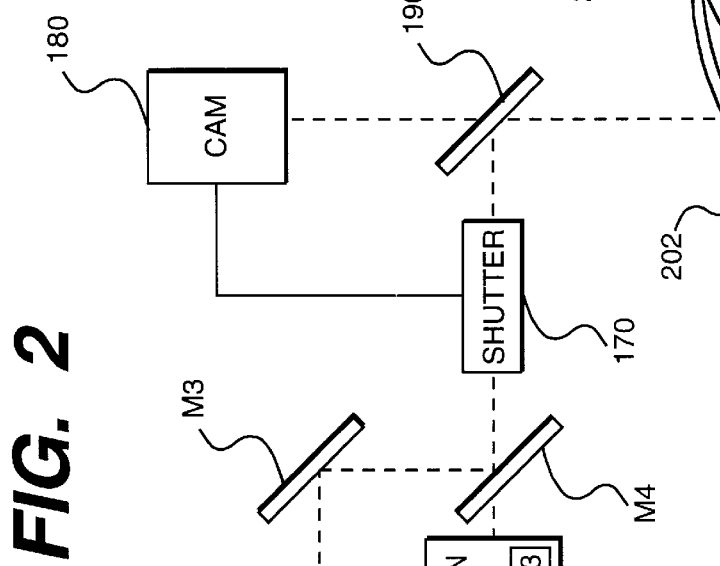
FIG. 2 is a drawing of an exemplary article which can be drilled with the apparatus of FIG. 1.

FIG. 2 illustrates an exemplary target 200 in greater detail. The target 200 typically comprises a metallic substrate 208 coated with a nonmetallic layer 206. The target 200 may be an airfoil, for example, having a substrate 208 comprising a nickel based superalloy such as Rene N5 or Hastalloy-x, coated with a nonmetallic thermal barrier coating 206. The thermal barrier coating 206 is typically a ceramic material such as yttria stabilized zirconia. Other conventional thermal barrier coatings include magnesia stabilized zirconia, calcia stabilized zirconia, calcium silicate, and mullite, for example.

A bond coat 207 may be applied between the nonmetallic layer 206 and the metallic substrate 208 to improve the adhesion of the nonmetallic layer 206 to the substrate 208. The bond coat 207 may comprise NiCrAlY which is air plasma sprayed (APS) onto the substrate 208, or PtAl which is applied by electron beam physical vapor deposition (EBPVD) to the substrate 208, for example. The nonmetallic layer 206 is then typically applied to the bond coat 207 using the same method as was used to apply the bond coat 207 (e.g. APS or EBPVD).

Referring again to FIG. 1, the coherent beam in the oscillator 110 is amplified by the amplification medium 120 as it passes through the amplification medium. The amplification medium 120, which is typically a slab of neodymium-doped yttrium-aluminum-garnet (Nd:YAG), is pumped to a state of population inversion by two pumps 130. The pumps 130 typically comprise an array of laser diodes, for example those manufactured by Spectra Diode Labs (SDL) in San Jose, California, but may also comprise xenon or krypton flashlamps. The pumps 130 transmit energy into the amplification medium 120, raising the energy level of the neodymium ions to a state of population inversion. As the coherent beam passes through the amplification medium 120 in this state, the coherent beam is amplified as the neodymium ions emit photons by stimulated emission. To reduce the effects of thermal distortions in the Nd:YAG slab, the coherent beam may be propagated through different regions (e.g. inner and outer) of the Nd:YAG slab by internal reflection so that each ray passes through substantially identical thermal environments, as described in commonly-owned U.S. Pat. No. 3,633,126 to Martin et al. Although the Nd:YAG slab laser is a preferred embodiment of the invention, other types of lasers, such as excimer lasers, can be used in other embodiments of the invention.

A Q-switch 150 is provided in the oscillator 110 to control the output of the oscillator. The Q-switch is typically an acousto-optic switch which comprises a piezoelectric transducer mounted to a quartz block. The piezoelectric transducer generates ultrasonic waves which propagate through the quartz block and which deflect the coherent beam to prevent lasing. The Q-switch is used to inhibit lasing between laser pulses. The pulses are generated by applying a voltage to the Q-switch to inhibit lasing while the pumps 130 transmit energy to the amplification medium 120 to raise the amplification medium to a state of population inversion. Next, the voltage on the Q-switch is reduced to permit lasing to occur, so that the coherent beam is amplified, and a portion is output through the output coupler 160 as a laser pulse. These steps are repeated to output a series of pulses for laser drilling.

Each pulse typically has a full width half maximum pulse width of less than or equal to 500 nanoseconds, for example between about 10 and 500 nanoseconds, more typically between about 50 and 200 nanoseconds, most typically about 100 nanoseconds. Each pulse typically has a pulse energy of less than or equal to 100 millijoules, for example between about 1 and 100 millijoules, more typically between about 5 and 15 millijoules, most typically about 10 millijoules. Each pulse typically has a pulse repetition rate between about 1 and 50 KHz, more typically between about 5 and 15 kHz, most typically about 10 kHz. The peak power of each pulse is typically between about 10,000 and 10,000,000 watts, more typically above 1,000,000 watts, and the average power is typically between about 10 and 5,000 watts. The Nd:YAG slab laser is able to output a laser beam which has a beam quality of between about 1 and 10 times a diffraction limit of the beam.

As shown in FIG. 1, the apparatus 100 includes a harmonic generator unit 210 which can be used to generate harmonics of the laser beam output from the oscillator 110. The harmonic generator unit 210 may include a plurality (e.g. 3) of conventional harmonic generators HG1, HG2, HG3 which each increase the frequency and decrease the wavelength of an incident laser beam. The harmonics generated are beneficial for improving the energy coupling of the laser beam into the substrate 208 and nonmetallic coating 206 of the target 200, since the absorptivity of most metallic and nonmetallic materials is higher for shorter wavelength beams. The improved energy coupling and absorptivity results in decreased thermal and mechanical damage, e.g., cracking, to the substrate 208, the nonmetallic coating 206, and the interface between the nonmetallic coating 206 and the bond coat 207, for example.

Typically, each of the harmonic generators HG1, HG2, HG3 comprises a nonlinear crystal having atoms which absorb a number of photons (e.g. 2) at one frequency and emit a photon at a higher frequency and shorter wavelength. For example, the first harmonic generator HG1 may convert a portion of a 1.064 micron wavelength beam from the oscillator 110 into a 0.532 micron wavelength beam. The second harmonic generator HG2 may convert a portion of the 0.532 micron wavelength beam into a beam of 0.355 micron wavelength, and the third harmonic generator HG3 may convert a portion of the 0.355 micron wavelength beam into a beam of 0.266 micron wavelength. The harmonic generator unit 210 may include internal mirrors (not shown) which direct the laser beam as desired through one, two, or three of the harmonic generators to provide a choice of the final wavelength. Additional harmonic generators can be included in the harmonic generator unit 210 if desired.

A typical harmonic generator converts only a portion, e.g. 50%, of the incident beam to a shorter wavelength. Thus, each harmonic generator HG1, HG2, HG3 may include an optical filter to remove the unconverted portion of the incident beam. The filter may comprise, for example, a frequency selective mirror which reflects or transmits incident light based on its frequency. The beam output from a harmonic generator thus has a shorter wavelength which is advantageous for drilling the nonmetallic layer 206, but typically has a lower power due to the energy loss from filtering.

According to one embodiment of the invention, the harmonic generator unit 210 is used to shorten the wavelength of the beam incident on the nonmetallic coating of the target 200 from 1.064 microns to 0.355 microns. The 1.064 micron wavelength beam output from the oscillator 110 passes through the first and second harmonic generators HG1, HG2 of the harmonic generator unit 210 where its wavelength is decreased from 1.064 microns to 0.532 microns to 0.355 microns. This shorter wavelength beam is effective for drilling through the nonmetallic layer 206 without damaging the nonmetallic layer and without creating cracks between the nonmetallic layer 206 and the bond layer 207.

After the beam has drilled through the nonmetallic layer 206, the mirrors M1, M2, M3, and M4 are used to circumvent the harmonic generator unit 210 so that the metal substrate 208 of the target 200 receives the 1.064 micron wavelength laser beam. This method is advantageous, because the shorter wavelength beam produces a substantially damage-free interface at the nonmetallic layer 206 and good quality sidewall through the nonmetallic layer 206, while the longer wavelength beam drills through the metallic substrate 208 at a higher rate because it has a higher power. The switching is executed, for example, by mounting the mirrors M1 and M4 on motorized positioners which physically move the mirrors M1 and M4 to redirect the beam away from the harmonic generator unit 210. The switching can be activated automatically after a predetermined time period which corresponds to the time it takes to drill through the nonmetallic layer 206, for example.

Other embodiments include drilling the nonmetallic coating 206 with a 0.266 micron wavelength beam, and switching to a 0.532 micron wavelength beam for the metallic substrate 208 of the target 200 with the internal mirrors of the harmonic generator unit 210, which also can be mounted on motorized positioners. This embodiment is advantageous, because the 0.532 micron wavelength beam produces a smaller recast layer in the metallic substrate 508 than the recast layer produced by a 1.064 micron wavelength beam. Other combinations of wavelengths which accommodate the considerations of processing speed and quality can be used to drill through a particular nonmetallic layer 206 and substrate 208, as will be recognized by those skilled in the art. For example, a particular nonmetallic layer 206 can be drilled with a short wavelength which produces a high quality hole, after which one or more harmonic generators are circumvented to increase the power of the beam for faster drilling through the less sensitive substrate 208.

According to exemplary embodiments of the invention, at a pulse energy of about 10 millijoules, a relatively small amount of material of the substrate 208 or nonmetallic layer 206 of the target 200 is removed by each pulse. The oscillator 110, however, can operate at a relatively high pulse repetition rate of between 1 and 50 kHz, which increases processing speed over that of many conventional methods. In addition, the peak power of each pulse is increased over that of conventional methods, for example to 100,000 or 1,000,000 watts according to exemplary embodiments. At this peak power, with a hole diameter of about 0.010 inch and an intensity of $10^8$ W/cm$^2$, for example, the mechanism by which material is removed from the substrate or nonmetallic coating of the target 200 is primarily by ablation or evaporation, rather than by melting.

Removal of material by ablation is beneficial because it significantly reduces cracking in the interface between the bond coat 207 and the nonmetallic layer 206, which has been problematic in known systems. Removal of material by ablation is also beneficial since the recast layer, i.e., the layer of resolidified molten material, is reduced in both the substrate 208 and the nonmetallic layer 206 of the target 200. For example, the recast layer for a hole of diameter 0.010–0.02 inch in an N5 superalloy is about 5 microns with an embodiment of the present invention, which is significantly smaller than the 50 micron recast layer produced by conventional methods. The recast layer is typically prone to microcracking and geometrical irregularities which may affect the airflow in an airfoil, for example. In addition, because material is removed by ablation rather than by melting, the substrate 208 and nonmetallic layer 206 of the target 200 both have a smaller heat affected zone, which reduces the chance of microcracking.

The use of shorter wavelength beams generated by the harmonic generator unit 210 further improves performance by reducing cracking in the interface between the bond coat 207 and the nonmetallic layer 206 due to improved energy coupling. The shorter wavelength beam also further reduces the size of the recast layer and heat affected zone in the substrate 208 and nonmetallic layer 206 due to improved energy coupling.

The apparatus 100, according to exemplary embodiments of the invention, also provides improved dimensional control of the drilled hole. For example, typically only a relatively small amount of material is removed in each of thousands of pulses by ablation. Thus, the hole drilled by exemplary embodiments of the invention has much less irregularity than holes drilled by expulsion of molten material with only 3 or 4 high energy pulses, as is typical in conventional laser drilling methods which can produce holes having a bamboo shaped axial cross section, i.e. a hole diameter which varies along the hole axis. The apparatus 100 can also produce a high beam quality (e.g. between 1 and 10 times a diffraction limit), which allows holes of high aspect ratio (ratio of depth to diameter) to be drilled, for example an aspect ratio of 15, and holes of very small diameter, e.g., down to several microns.

An additional advantage provided by exemplary embodiments of the invention is the ability to dispense with a wax beam blocker to shield objects, such as the back wall of a hollow airfoil, from the laser beam after it has drilled through the target 200. As shown in FIG. 1, the apparatus 100 includes a camera 180 which monitors the hole being drilled in the target 200. The camera 180 is typically configured to monitor the reflected light from the hole 202 being drilled in the target 200. Before the laser beam has broken through to the interior of the target 200, the bottom of the hole 202 is reflective. As soon as the laser breaks through to the interior of the target 200, a sudden drop in reflected energy is detected by the camera 180, since the beam enters the interior of the target 200. At this point, the camera 180 signals the shutter 170 to close, to interrupt the laser drilling process.

The camera 180 and shutter 170 are typically configured to stop the drilling process before a subsequent pulse reaches the target 200. Thus, the energy which can reach the back wall 204 of the target 200 is limited to the remainder of a single pulse. Since the energy of each pulse is typically small, e.g., between 1 and 100 millijoules, the damage to the back wall 204 of the target 200 caused by the pulsed laser beam is insignificant. By contrast, in conventional methods where the pulse energy is on the order of 10 joules, a beam blocking materials such as wax is necessary to prevent damage to the back wall caused by the high energy laser pulse after breakthrough. This is especially true if clean up pulses are needed to refine the geometry of the drilled hole, which is common in conventional laser drilling, since only a few high energy pulses are used to remove all the material by expulsion of molten material.

A test conducted by the inventor has confirmed that exemplary embodiments of the invention can produce holes substantially without cracks, such as in the nonmetallic layer interface. The test was conducted with a pulsed laser beam having a peak power of 1 megawatt, a wavelength of 0.532 micron, a pulse width of 300 nanoseconds, a pulse energy of 10 millijoules and an average power of 50 watts. The pulsed laser beam was generated with a Q-switched Nd:YAG laser to produce high quality 0.005 inch diameter holes in a Hastalloy-x superalloy coated with a layer of yttria stabilized zirconia. Other testing with excimer lasers has indicated that shorter wavelengths produce even better quality holes.

While the invention has been described with reference to particular embodiments, those skilled in the art will understand that various changes may be made without departing from the spirit and scope of the invention as defined by the following claims.

What is claimed is:

1. A method of drilling a hole in an article, the article comprising a metal substrate coated with a nonmetallic layer, the method comprising the steps of:
generating a pulsed laser beam, a pulse of the pulsed laser beam having an energy of less than or equal to 0.1 joule and a full width half maximum pulse width of less than or equal to 500 nanoseconds and a peak power of at least 10,000 watts;
directing the pulsed laser beam at the article to vaporize the nonmetallic layer, wherein a wavelength of the pulsed laser beam which vaporizes the nonmetallic layer is less than or equal to 0.532 microns; and directing the pulsed laser beam at the article to vaporize the substrate.

2. The method of claim 1, wherein the pulsed laser beam has a wavelength of less than or equal to 1.064 microns.

3. The method of claim 1, further comprising the step of:

reducing a wavelength of the pulsed laser beam with a harmonic generator to less than or equal to 0.532 microns before the pulsed laser beam is incident on the nonmetallic layer.

4. The method of claim 3, further comprising the step of eliminating the reducing step after the pulsed laser beam has drilled a hole through the nonmetallic layer.

5. The method of claim 1, wherein the nonmetallic layer comprises a ceramic material which acts as a thermal barrier.

6. The method of claim 1, wherein the nonmetallic layer comprises yttria stabilized zirconia.

7. The method of claim 1, wherein the substrate comprises a superalloy.

8. The method of claim 1, further comprising the step of generating the pulsed laser beam with a Nd:YAG laser.

9. The method of claim 1, further comprising the step of generating the pulsed laser beam with an excimer laser.

10. The method of claim 1, wherein the article is an airfoil.

11. The method of claim 1, wherein the pulsed laser beam has a repetition rate of between 1 and 50 kHz.

12. The method of claim 1, wherein the pulsed laser beam has a peak power of between 10,000 and 10,000,000 watts.

13. The method of claim 1, wherein the pulsed laser beam has an average power of between 10 and 5,000 watts.

14. The method of claim 1, wherein the pulsed laser beam has a peak power of greater than 100,000 watts.

15. The method of claim 1, wherein the pulsed laser beam has a peak power of greater than 1,000,000 watts.

16. The method of claim 1, wherein the pulsed laser beam is stationary with respect to the article, and the hole is substantially the same size as the pulsed laser beam.

17. The method of claim 1, further comprising the steps of:

monitoring the hole with a camera; and terminating the drilling when the camera detects that the hole has been drilled through the article.

18. A drilling apparatus comprising:

a laser which produces a pulsed laser beam, a pulse of the pulsed laser beam having an energy of less than or equal to 0.1 joule and a pulse width of less than or equal to 500 nanoseconds and a peak power of at least 10,000 watts, the pulsed laser beam having a first frequency component; and a harmonic generator which generates a second frequency component, the second frequency being greater than the first frequency;

wherein the laser beam, after passing through the harmonic generator, is incident on an article comprising a substrate coated with a nonmetallic layer to vaporize the nonmetallic layer.

19. The apparatus of claim 18, further comprising an optical filter which receives the pulsed laser beam from the harmonic generator, wherein the optical filter filters the first frequency component.

20. The apparatus of claim 18, further comprising:

an optical element which redirects the pulsed laser beam away from the harmonic generator after the pulsed laser beam has drilled through the nonmetallic layer.

21. The drilling apparatus of claim 18, wherein the laser comprises a slab of Nd:YAG.

22. The drilling apparatus of claim 18, wherein the laser comprises at least one of a krypton flash lamp pump and a xenon flash lamp pump.

23. The method of claim 18, wherein the pulsed laser beam produced by the laser has a repetition rate of between 1 and 50 kHz.

24. The method of claim 18, wherein the pulse produced by the laser has a peak power of between 10,000 and 10,000,000 watts.

25. The method of claim 18, wherein the pulsed laser beam produced by the laser has an average power of between 10 and 5,000 watts.

26. A method of drilling a hole in an article, the article comprising a substrate coated with a nonmetallic layer, the method comprising the steps of:

generating a pulsed laser beam, a pulse of the pulsed laser beam having a peak power of greater than 100,000 watts and less than or equal to 10,000,000 watts;

directing the pulsed laser beam at the article to vaporize the nonmetallic layer; and directing the pulsed laser beam at the article to vaporize the substrate.

27. The method of claim 26, wherein a pulse of the pulsed laser beam has a full width half maximum pulse width of less than or equal to 500 nanoseconds.

28. The method of claim 26, wherein a pulse of the pulsed laser beam has a full width half maximum pulse width of less than or equal to 300 nanoseconds.

29. The method of claim 26, wherein a pulse of the pulsed laser beam has a pulse energy of less than 50 millijoules.

30. The method of claim 26, wherein a pulse of the pulsed laser beam has a pulse energy of 1–10 millijoules.

31. The method of claim 26, further comprising the step of reducing a wavelength of the pulsed laser beam with a harmonic generator to less than or equal to 0.532 microns before the pulsed laser beam is incident on the nonmetallic layer.

32. The method of claim 31, further comprising the step of increasing the wavelength of the pulsed laser beam after the pulsed laser beam has drilled through the nonmetallic layer.

33. The method of claim 26, wherein the pulsed laser beam is stationary with respect to the article, and the hole is substantially the same size as the pulsed laser beam.

34. A method of drilling a hole in an article, the article comprising a substrate coated with a nonmetallic layer, the method comprising the steps of:

generating a pulsed laser beam, a pulse of the pulsed laser beam having a wavelength which is less than or equal to 0.532 microns;

directing the pulsed laser beam at the article to vaporize the nonmetallic layer;

increasing the wavelength of the pulsed laser beam; and directing the pulsed laser beam at the article to vaporize the substrate.

\* \* \* \* \*